US009541584B2

(12) United States Patent
Goeke

(10) Patent No.: US 9,541,584 B2
(45) Date of Patent: Jan. 10, 2017

(54) DIGITAL VOLTMETER TOPOLOGY

(71) Applicant: Keithley Instruments, Inc., Cleveland, OH (US)

(72) Inventor: Wayne Goeke, Hudson, OH (US)

(73) Assignee: KEITHLEY INSTRUMENTS, INC., Cleveland, OH (US)

( * ) Notice: Subject to any disclaimer, the term of this patent is extended or adjusted under 35 U.S.C. 154(b) by 39 days.

(21) Appl. No.: 13/849,265

(22) Filed: Mar. 22, 2013

(65) Prior Publication Data

US 2014/0285181 A1 Sep. 25, 2014

(51) Int. Cl.
| | |
|---|---|
| *G01R 1/30* | (2006.01) |
| *G01R 17/16* | (2006.01) |
| *G01R 19/00* | (2006.01) |
| *G01R 19/25* | (2006.01) |
| G01R 15/22 | (2006.01) |

(52) U.S. Cl.
CPC ........... *G01R 19/2503* (2013.01); *G01R 15/22* (2013.01)

(58) Field of Classification Search
CPC ....... G01R 19/2503; G01R 15/08; G01R 1/30; G01R 1/06788; G01R 19/00; G01R 15/00; G01R 15/22; G01R 15/125; G01R 31/3004; G01R 19/0023; G01R 19/0069; G01R 19/0084; G01R 19/0092; G01R 19/25; G01R 1/04; G01R 1/0408; G01R 19/0038; G01R 15/002; G01R 15/12; H03F 1/00
USPC .................. 324/123, 74, 76.11–76.83, 99 D, 114,324/115, 116, 123 R, 123 C, 126, 128, 141, 142,324/140 R, 679, 156; 330/69, 258; 327/306, 327/307; 702/57, 64
See application file for complete search history.

(56) References Cited

U.S. PATENT DOCUMENTS

| | | | | |
|---|---|---|---|---|
| 2,284,476 | A | * | 5/1942 | Mackay .......................... 324/100 |
| 3,304,507 | A | * | 2/1967 | Weekes ................ G11C 27/026 327/95 |
| 3,375,457 | A | * | 3/1968 | Hollstein, Jr. ............ H03F 3/26 313/565 |
| 3,832,646 | A | * | 8/1974 | Szabo ........................ H03F 1/26 330/258 |
| 4,152,659 | A | * | 5/1979 | Gordon ..................... H03F 3/45 330/108 |
| 4,393,347 | A | * | 7/1983 | Looper ..................... G01R 1/30 324/123 R |
| 4,433,287 | A | * | 2/1984 | Morita et al. .................. 324/115 |
| 5,061,859 | A | * | 10/1991 | Lovelace ............. H04B 10/802 250/551 |
| 5,594,329 | A | * | 1/1997 | van Ettinger et al. .......... 324/96 |
| 5,612,698 | A | * | 3/1997 | Reay ............................. 341/167 |
| 6,133,787 | A | * | 10/2000 | Yerkovich et al. ............. 330/68 |
| 2011/0196211 | A1 | * | 8/2011 | Al-Ali et al. .................. 600/300 |

* cited by examiner

*Primary Examiner* — Arleen M Vazquez
*Assistant Examiner* — Steven Yeninas
(74) *Attorney, Agent, or Firm* — Michael A. Nelson; Marger Johnson

(57) ABSTRACT

A system may include two input terminals, e.g., HI and LO, and a floating circuit that is physically separate from the input terminals and includes a gain amplifier. The floating circuit can be surrounded by a conductive enclosure that is electrically connected to the second input terminal. The floating circuit can further switch between input signals received from the first and second input terminals to the gain amplifier and the floating circuit ground.

11 Claims, 1 Drawing Sheet

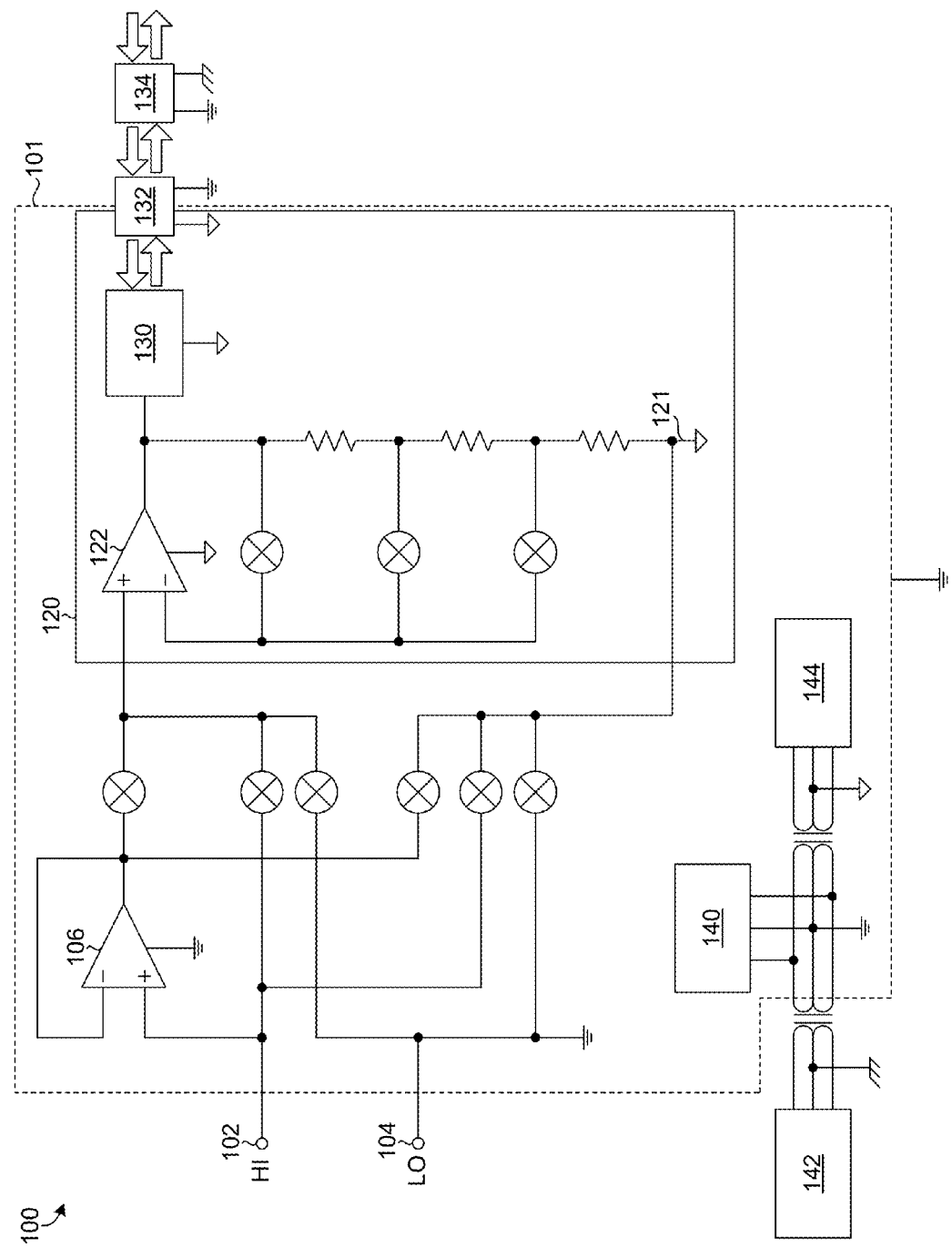

DIGITAL VOLTMETER TOPOLOGY

BACKGROUND

Over the years, certain digital voltmeter (DVM) designs have improved input signal observation time but have also concurrently introduced sensitivity to the offset drift of the input amplifier feedback, thus limiting the performance of the product. For example, certain nanoVolt DVMs have used a measure zero cycle to remove the input amplifier's offset. In such DVMs, a measurement with the input applied to the input amplifier is typically made followed by a measurement with zero applied. The difference thus removes the input amplifier's offset but the zero cycle is time spent not measuring the input signal.

Other designs have used a reversing input amplifier that inverses its offset between each measurement. Thus, by averaging two adjacent measurements, the input amplifier's offset is cancelled and the input can be observed during both measurements thereby reducing the noise. However, the offset drift of the input amplifier's feedback is not cancelled and, therefore, limits the performance of the unit.

Accordingly, a need remains for a design that maintains high observation time while removing the detrimental sensitivity to the feedback offset drift.

SUMMARY

Embodiments of the disclosed technology are generally directed to low-voltage voltage measurement devices that include two inputs (HI and LO) and a floating digital voltmeter (DVM) within a guard shield.

BRIEF DESCRIPTION OF THE DRAWINGS

FIG. 1 illustrates an example of a digital voltmeter (DVM) circuit topology in accordance with certain embodiments of the disclosed technology.

DETAILED DESCRIPTION

Embodiments of the disclosed technology are generally directed to a topology that has good observation efficiency and cancels the input amplifier's offset as well as its feedback offset.

FIG. 1 illustrates an example of a digital voltmeter (DVM) circuit topology 100 in accordance with certain embodiments of the disclosed technology. The DVM circuit topology 100 includes a floating low-noise DVM 120 and two input terminals (here, a HI input 102 and a LO input 104) that may be routed to, e.g. switched between, either the positive input of a gain amplifier 122 of the floating DVM 120 or to the floating circuit ground 121 of the floating DVM 120.

In the illustrated example, the floating DVM 120 may be electrically connected to the input terminals 102 and 104 with either polarity. A pre-charge or buffer amplifier 106 may be used to allow for reversal of the connection between the inputs 102 and 104 and the floating DVM 120 without a large charge pump-out, for example. The illustrated buffer amplifier 106 has its input connected to the first input terminal 102 and its supply referenced to the second input terminal 104 in order to allow either floating circuit input to be pre-charged to a voltage that is nearly equal to the first terminal voltage prior to the first terminal being connected to that floating circuit input.

In the illustrated example, a conductive enclosure or guard shield 101 surrounds most of the DVM circuit topology 100, specifically the floating DVM 120, and is electrically connected to the second input terminal 104 such that there is virtually no capacitance between the floating DVM 120 and any circuitry or component other than the second input terminal 104, e.g., a LO input signal. The conductive enclosure 101 may be made of metal or any other suitable electrically conductive material.

In the illustrated example, the floating DVM 120 may have a circuit GND-based power supply 144 that is electrically coupled with a LO power supply 140, which may also be electrically coupled with an earth GND-based power supply 142. In alternative embodiments, any of a number of other power supply arrangements may be used so long as the supply for the floating DVM 120 does not introduce significant coupling to earth GND circuit elements.

In the illustrated example, an analog-to-digital converter (ADC) 130 is configured to provide an output to an isolated communication means such as the illustrated first opto-coupling component 132, for example. A second isolated communication means, such as the illustrated second opto-coupling component 134, positioned outside the guard shield 101 may also be used. As with the alternative power supply arrangements discussed above, alternatives to the illustrated isolated communication means should focus on those that result in no more than an insignificant coupling between the floating DVM 120 and the earth GND circuit elements.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

I claim:

1. A system comprising:
    a first input terminal;
    a second input terminal;
    a floating circuit that is physically separated from the first and second input terminals by a conductive enclosure that has the same electric potential as the second input terminal, wherein the floating circuit includes a gain amplifier and is surrounded by the conductive enclosure; and
    one or more switches within the conductive enclosure and configured to switch input signals received from the first and second input terminals between a positive input of the gain amplifier and a floating circuit ground of the floating circuit.

2. The system of claim 1, wherein the first input terminal is configured to receive a HI input signal, and further wherein the second input terminal is configured to receive a LO input signal.

3. The system of claim 1, wherein the conductive enclosure is made of metal.

4. The system of claim 1, further comprising a buffer amplifier having an input connected to the first input terminal and a supply referenced to the second input terminal, wherein the buffer amplifier is configured to allow either of two floating circuit inputs to be pre-charged to a voltage that is nearly equal to the first input terminal voltage prior to the first input terminal being connected to a first one of the two floating circuit inputs.

5. The system of claim 1, further comprising an analog-to-digital converter (ADC) configured to provide an output to a first isolated communication means.

6. The system of claim 5, wherein the first isolated communication means includes an opto-coupling component.

7. The system of claim 5, wherein the first isolated communication means is coupled with a second isolated communication means.

8. The system of claim 7, wherein the first and second isolated communication means each include an opto-coupling component.

9. The system of claim 7, wherein the second isolated communication means is positioned outside the conductive enclosure.

10. The system of claim 1, further comprising a LO power supply configured to provide power to the floating circuit from an earth GND-based power supply, and a circuit GND-based power supply configured to provide power to the floating circuitry from the output of the LO power supply.

11. The system of claim 1, wherein the floating circuit is a floating digital voltmeter circuit, the system further comprising:
a buffer amplifier having an input connected to the first input terminal and a supply referenced to the second input terminal;
a LO power supply configured to provide power to the floating circuit from an earth GND-based power supply; and
a circuit GND-based power supply configured to provide power to the floating circuitry from the output of the LO power supply.

* * * * *